United States Patent
Gambini

(10) Patent No.: US 6,574,251 B1
(45) Date of Patent: Jun. 3, 2003

(54) METHOD AND DEVICE FOR STABILIZING THE EMISSION WAVELENGTH OF A LASER SOURCE

(75) Inventor: Piero Gambini, Turin (IT)

(73) Assignee: Agilent Technologies, Inc., Palo Alto, CA (US)

( * ) Notice: Subject to any disclaimer, the term of this patent is extended or adjusted under 35 U.S.C. 154(b) by 27 days.

(21) Appl. No.: 09/631,984

(22) Filed: Aug. 3, 2000

(30) Foreign Application Priority Data

Aug. 5, 1999 (IT) ......................................... TO99A0692

(51) Int. Cl.[7] .............................. H01S 3/10; H01S 3/13
(52) U.S. Cl. ....................................... 372/28; 372/29.02
(58) Field of Search ................................. 372/28, 29.02

(56) References Cited

U.S. PATENT DOCUMENTS

| | | | |
|---|---|---|---|
| 4,817,101 A | 3/1989 | Wyeth et al. | |
| 5,440,207 A | 8/1995 | Otsuka | |
| 5,754,714 A | * 5/1998 | Suzuki et al. | 385/5 |

FOREIGN PATENT DOCUMENTS

| | | |
|---|---|---|
| EP | 0 660 470 A1 | 6/1995 |
| EP | 0 660 470 | 6/1995 |
| JP | 10173602 | 6/1998 |

OTHER PUBLICATIONS

Latrasse, C. et al, "Absolute Frequency Control of a 1560 nm (192 THz) DFB Laser Locked to a Rubidium Absorption Line Using a Second–Harmonic–Generated Signal," *IEEE Transactions on Instrumentation and Measurement*, vol. 44, No. 4, Aug. 1995, pp. 839 ff.

Kourogi, M. et al, "Wide–Span Optical Frequency Comb Generator for Accurate Optical Frequency Difference Measurement," *IEEE Journal of Quantum Electronics*, vol. 29, No. 10, Oct. 1993, pp. 2693 ff.

Wang, W., et al, "Generation of Frequency–Tunable Light and Frequency Reference Grids Using Diode Lasers for One–Petahertz Optical Frequency Sweep Generator," *IEEE Journal of Quantum Electronics*, vol. 31, No. 3, Mar., 1995, pp. 456.

Abstract of JP Patent 10173602.

Kourogi, M. et al, "Wide–Span Optical Frequency Comb Generator for Accurate Optical Frequency Difference Measurement," *IEEE Journal of Quantum Electronics*, 29(1993) Oct., No. 10, New York.

Pankove, Jacques I., *Optical Processes in Semiconductors*, pp. 268–278, Dover Publications, Inc. (New York) 1971.

* cited by examiner

*Primary Examiner*—Paul Ip
*Assistant Examiner*—Cornelius H Jackson

(57) ABSTRACT

A process and device are provided for stabilizing the emission wavelength of an optical source, which emits radiation at a first wavelength, by locking to the emission wavelength of an optical reference source which emits radiation at a second wavelength which is substantially different from the first. The stabilization device applies to the source to be stabilized a feedback signal obtained by detection of an optical beat between the two radiations. A two-photon absorption for the first wavelength is used to generate the beat.

18 Claims, 1 Drawing Sheet

METHOD AND DEVICE FOR STABILIZING THE EMISSION WAVELENGTH OF A LASER SOURCE

FIELD OF INVENTION

The present invention relates to lasers, and more particularly to a method and device for stabilizing the emission wavelength of a laser source, in which this stabilization is achieved by locking to a reference wavelength which is very different from that which is to be stabilized.

Preferably, but not exclusively, the invention is applied to the stabilization of the emission wavelength of a semiconductor laser used as the source in an optical communication system.

BACKGROUND ART

It is Known the emission wavelength of lasers is subject to fluctuations, and therefore the lasers are associated with control circuits which detect the deviation from the nominal value and generate an error signal which is sent to the laser operating devices to keep the emission wavelength at this nominal value.

In a commonly used stabilization method, the emission wavelength of the laser is locked to an atomic or molecular line, e.g. an absorption line of a gas which has an absorption spectrum with lines whose wavelength is close to the emission wavelength of the source. An example of a locking method of this type for the application, preferred here, to the field of optical telecommunications, is described in European Patent 0 660 470. This stabilization is absolute, in other words independent of the environment, and provides the source with good short- and long-term stability and good reproducibility of the emission wavelength.

In general, however, atomic or molecular lines close to those used for optical telecommunications are relatively wide and therefore the stabilization achieved may be insufficient. For this reason, numerous proposals have been made in the literature for the provision of locking on absorption lines at wavelengths relatively distant from that of the source to be stabilized, which have more advantageous characteristics for the intended purposes. An example is that of an absorption line of rubidium at 780 nm. Absorption lines at this wavelength are used for the purposes of stabilization in various fields, including those which are very different from telecommunications (e.g. metrology).

However, it is generally difficult to produce wavelength comparison systems for signals having very different wavelengths from each other, and therefore attempts are made to bring the wavelengths for comparison closer to each other.

The article "Absolute Frequency Control of a 1560 nm (192 THz) DFB laser locked to a Rubidium Absorption Line Using a Second-Harmonic-Generated Signal", by C. Latrasse and others, IEEE Transactions on Instrumentation and Measurement, vol. 44, no. 4, August 1995, pp. 839 ff., describes a system in which the radiation at 1560 nm emitted by the laser to be stabilized is directed into a crystal of $KNbO_3$ which generates its second harmonic (corresponding to a wavelength of 780 nm). This second harmonic is separated from the main signal at 1560 nm and sent to a cell containing $^{87}Rb$ for interaction with the line at 780 nm. The signal leaving the cell is subsequently detected in a silicon photodiode to produce the error signal to be supplied to the laser control devices.

Other methods, such as those described in the articles "Wide-Span Optical Frequency Comb Generator for Accurate Optical Frequency Difference Measurement", by M. Kourogi and others, IEEE Journal of Quantum Electronics, vol. 29, no. 10, October 1993, pp. 2693 ff., and "Generation of Frequency-Tunable Light and Frequency Reference Grids Using Diode Lasers For One-Petahertz Optical Frequency Sweep Generator", vol. 31, no. 3, March 1995, pp. 456 ff., produce the stabilization by locking the laser source to be stabilized to a highly stable reference source. For this locking, optical signals with a frequency equal to the sum of and/or the difference between the frequencies of the two sources are generated, and the beat signals are detected. These beat signals are then fed back to act on the laser to be controlled.

In all these known methods, the creation of the error signal requires two separate operations: the first is the generation of an optical signal at a suitable frequency by the generation of a harmonic of the signal to be stabilized (in the case of the first document cited) or the mixing of this with a reference signal; the second operation is the detection of the converted signal. This makes the corresponding equipment complicated and makes the process inefficient.

The object of the invention is to provide a method and equipment which enable this disadvantage to be overcome.

SUMMARY OF THE INVENTION

According to the invention, a method is provided for stabilizing the emission wavelength of an optical source which emits coherent radiation at a first wavelength, by locking to the emission wavelength of an optical reference source, which emits coherent radiation at a second wavelength which is substantially different from the first, in which method the radiations at the first and second wavelengths are made to interact an optically electrical signal resulting from the interaction is detected, a feedback signal is produced from the detected signal, and the said interaction is represented by a two-photon absorption for the first wavelength, which gives rise to a beat signal having a frequency equal to the difference in frequency between a radiation at a wavelength which is half the first wavelength and the second radiation, this beat being detected concurrently with its creation.

The invention also relates to the device for implementing the method.

The phenomenon of two-photon absorption is a non-linear phenomenon based on the fact that two photons which are coherent in phase can interact to excite an electron in a semiconductor material to an energy twice that of a single photon. Owing to this phenomenon, a coherent radiation to which the material would be transparent can be absorbed, thus generating electron-hole pairs. These can then be detected as a photodetection current. A fuller description of the phenomenon can be found, for example, in "Optical processes in semiconductors" by J. I. Panhove, Dover Publications, Inc., New York, USA, 1971: see, in particular, Sections 12-A-4 and 12-A-5 on pp. 268 ff.

BRIEF DESCRIPTION OF THE DRAWING

For additional clarification, reference should be made to the attached drawing, which shows a preferred embodiment of the device according to the invention.

DETAILED DESCRIPTION OF THE DRAWING

Figure 1:
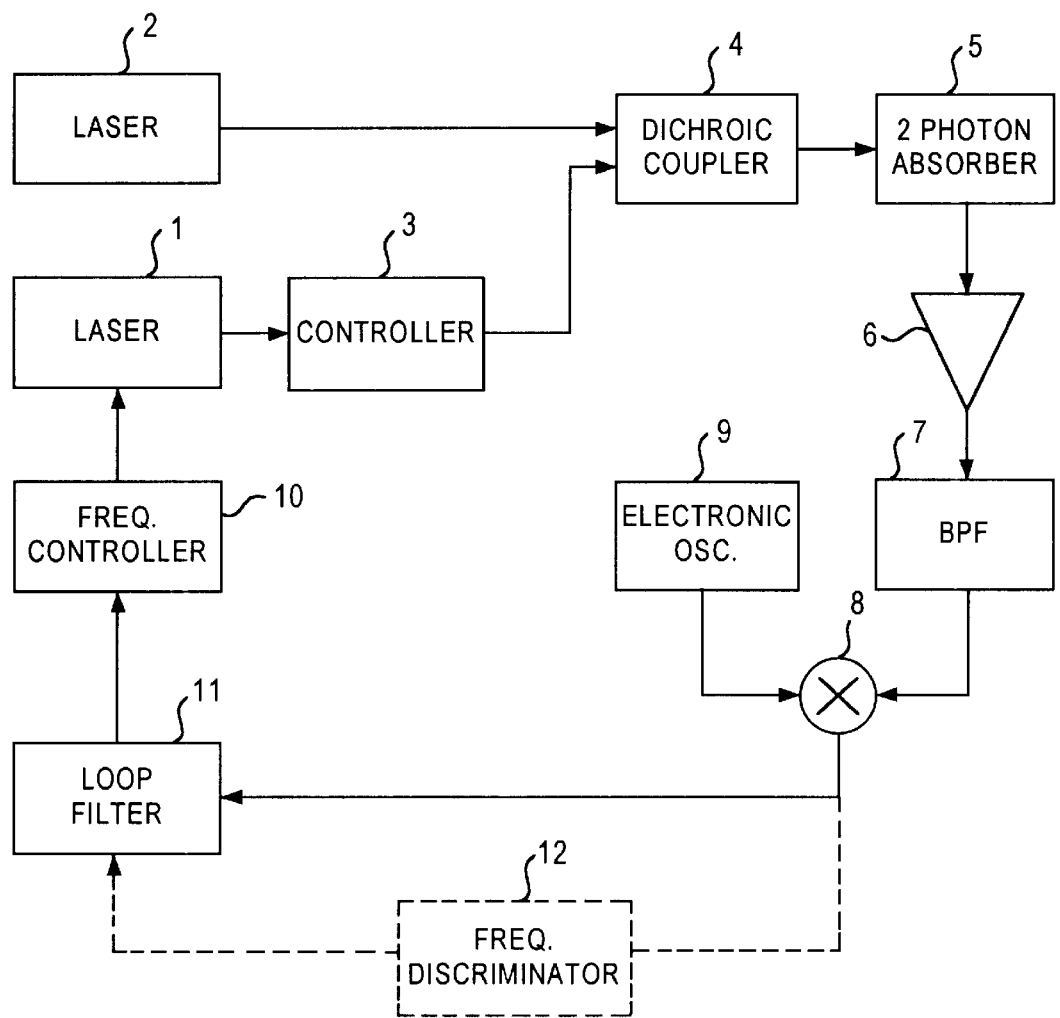

The device illustrated in the sole figure can be used to stabilize a source 1 to be stabilized, which operates at a wavelength L1, by locking to a reference source operating at a wavelength L2 which is very different from L1. In particular, by way of example and without restrictive intent, reference will be made in the following test to a source 1 which emits radiation in the third optical communication window (in particular at 1560 nm) and a reference source 2 which emits at 780 nm. Clearly, the reference source 2 must be a highly stable source. The method by which the source 2 is stabilized has no effect for the purposes of the present invention. In the example under consideration, in which the source 2 emits at 780 nm, the stabilization can be carried out by locking to an Rb absorption line.

The radiation to be stabilized (subjected to polarization control in an entirely conventional control device 3 if required) and the reference radiation are supplied to a dichroic coupler 4 which supplies the two radiations to a device 5 capable of making the two radiations interact by means of the phenomenon of two-photon absorption for the higher wavelength L1, and of detecting an electrical beat resulting from the interaction.

This beat, because of the nature of the two-photon absorption, has the frequency $|2f_1-f_2|$, where $f_1$ and $f_2$ are the frequencies corresponding to the wavelengths L1 and L2. This sets a limit to the difference between the two wavelengths, which must be such as to permit the detection of the beat by means of the device 5 which is used.

As widely reported in the literature, devices in which two-photon absorption is carried out for radiation with a wavelength of approximately 1.5 $\mu$m can be silicon avalanche photodiodes, LEDs of various types, or laser diodes.

When two-photon absorption is used, the operation of combining the two wavelengths and the detection of the resulting signal take place in a single device, thus simplifying the structure. Moreover, the use of a dichroic coupler prevents losses in the superimposition of the fields of the two radiations whose beat is created. A further advantage of the solution according to the invention is that no optical filtering is needed to eliminate unwanted products of the combination, whereas this would be required by methods based on the generation of the sum of, and difference between, the frequencies of the radiations which are made to interact.

Clearly, in order for the two-photon absorption to take place, the source 1 must have a sufficiently high power, e.g. a power of the order of a few tens of mW.

To simplify the drawing, the means (e.g. optical fibres) for carrying the radiations to the dichroic coupler 4 and from this to the device 5 are not shown.

The output of the device 5, which as stated above is a signal at the frequency $|2f_1-f_2|$, is an electrical signal that is amplified in an amplifier 6, filtered in a band-pass filter 7 to reduce the noise and compared in a mixer 8 with a signal at radio frequency generated by a high-stability electronic oscillator 9, in order to produce a feedback signal for the laser 1. This signal will be supplied to the control devices 10 of the laser 1 in a conventional way through a loop filter 11.

The frequency of the oscillator 9 can be selected according to the beat frequency and the type of feedback which is to be produced. In particular, it is possible to use an oscillator 9 with a frequency equal to that of the beat created by the device 5: in this case, the mixer 8 can act directly as a phase discriminator and its output signal can be used directly to drive the laser. If the frequency of the oscillator 9 is different from the beat frequency, the mixer 8 will supply a signal at a frequency equal to the frequency difference between the signal supplied by the oscillator and the detected beat signal, and in this case the feedback signal will be obtained by means of an electronic frequency discriminator 12, of any known type, as indicated in broken lines in the figure. This is also the case when the detected beat signal is to be used directly.

Clearly, the above description is provided solely by way of example and without restrictive intent, and variants and modifications can be produced without departure from the scope of protection of the invention.

What is claimed is:

1. A method of stabilizing the emission wavelength of a first optical source emitting coherent optical radiation at a first frequency, the method being performed with the assistance of a second optical source emitting coherent optical radiation at a second frequency substantially displaced from the first frequency and a two-photon absorber, the method comprising causing optical energy from the first and second sources at the first and second frequencies to be simultaneously incident on the two-photon absorber which responds to the incident optical energy at the first and second frequencies from the first and second sources to derive an electric beat signal having a beat frequency equal to the difference between (a) twice the frequency of one of the incident frequencies and (b) the frequency of the other incident frequency, and controlling the emission wavelength of the first optical source in response to a component of the beat frequency of the electric beat signal.

2. The method of claim 1 where the two-photon absorber provides absorption for the first frequency so that the beat frequency is equal to two times the first frequency minus the second frequency.

3. The method of claim 2 wherein the second frequency is substantially twice the first frequency.

4. The method of claim 3 wherein the first frequency is a frequency in the third transmission window for optical communications.

5. The method of claim 1 further including detecting the electric beat signal, and mixing the detected beat signal with a highly stable radio frequency electric signal to derive an error signal, and controlling the emission wavelength of the first optical source in response to the error signal.

6. The method of claim 5 wherein the emission wavelength of the first optical source is electrically and automatically controlled in response to the error signal.

7. The method of claim 6 wherein the radio frequency signal has a frequency equal to that of the beat frequency of the electric beat signal.

8. The method of claim 6 wherein the radio frequency signal has a frequency different from that of the beat frequency of the electric beat signal to produce an electric signal having a non-zero frequency, applying the signal having a non-zero frequency to a frequency discriminator that derives the error signal.

9. The method of claim 1 wherein the emission wavelength of the first optical source is electrically and automatically controlled in response to the component of the beat frequency of the electric beat signal.

10. A device for stabilizing the emission wavelength of an optical source for emitting coherent radiation at a first wavelength with an optical reference source for emitting coherent radiation at a second wavelength substantially different from the first wavelength, the device comprising means for interacting the radiations at the first and second wavelengths, the means for interacting being arranged for performing two-photon absorption for directly deriving an electric beat signal, means for deriving an electric feedback signal in response to the electric beat signal resulting from the interaction, and electric circuitry for applying the electric feedback signal to the optical source to be stabilized for thereby controlling the emission wavelength of the optical source to be stabilized.

11. The device of claim 10 wherein the said source to be stabilized is adapted to emit radiation at a wavelength which is substantially twice the wavelength of the radiation emitted by the reference source.

12. The device of claim 11 wherein the said source to be stabilized is adapted to emit radiation at a wavelength in the third transmission window for optical communications.

13. The device of claim 10 further comprising a dichroic coupler for supplying the radiation emitted by the sources to the means for interacting.

14. The device of claim 10 wherein the means for deriving the feedback signal from the detected beat signal comprises means for mixing the detected beat signal with a radio frequency signal generated by the radio frequency generating means.

15. The device of claim 14 wherein the generating means is arranged to generate a signal at a frequency equal to that of the detected beat signal, and the said feedback signal is the output signal of the mixing means which operates as a phase discriminator.

16. The device of claim 14 wherein the said generating means is arranged to generate a signal at a frequency different from that of the detected beat signal, and the mixing means is coupled to a frequency discriminator for deriving the feedback signal.

17. Apparatus for stabilizing the emission wavelength of a first optical source for emitting coherent optical radiation at a first frequency with the assistance of a second optical source for emitting coherent optical radiation at a second frequency substantially displaced from the first frequency, the apparatus comprising a two-photon absorber adapted to be simultaneously responsive to the coherent optical radiation at the first frequency from the first optical source and to the coherent optical radiation at the second frequency from the second optical source, the two-photon absorber being arranged for deriving an electric beat signal having a beat frequency equal,to the difference between (a) twice the frequency of one of the sources and (b) the frequency of the other source, and electric feedback circuitry coupled to be responsive to the beat frequency signal for electrically controlling the emission wavelength of the first optical source in response to at least one component of the beat frequency of the electric beat signal.

18. The apparatus of claim 17 wherein the apparatus includes the first and second optical sources and the absorber is positioned to be simultaneously responsive to the first and second frequencies.

* * * * *